(12) United States Patent
Chang et al.

(10) Patent No.: US 11,362,464 B2
(45) Date of Patent: Jun. 14, 2022

(54) CONTACT ARRANGEMENT, CIRCUIT BOARD, AND ELECTRONIC ASSEMBLY

(71) Applicant: Shanghai Zhaoxin Semiconductor Co., Ltd., Shanghai (CN)

(72) Inventors: Nai-Shung Chang, New Taipei (TW); Yun-Han Chen, New Taipei (TW); Hsiu-Wen Ho, New Taipei (TW); Tsai-Sheng Chen, New Taipei (TW); Chang-Li Tan, New Taipei (TW); Chun-Yen Kang, New Taipei (TW); Hsin-Kuan Wu, New Taipei (TW)

(73) Assignee: Shanghai Zhaoxin Semiconductor Co., Ltd., Shanghai (CN)

( * ) Notice: Subject to any disclaimer, the term of this patent is extended or adjusted under 35 U.S.C. 154(b) by 0 days.

(21) Appl. No.: 17/027,714

(22) Filed: Sep. 22, 2020

(65) Prior Publication Data
US 2022/0052489 A1 Feb. 17, 2022

(30) Foreign Application Priority Data
Aug. 12, 2020 (TW) ................................ 109127288

(51) Int. Cl.
*H01R 9/03* (2006.01)
*H01R 13/6471* (2011.01)
*H01R 12/72* (2011.01)

(52) U.S. Cl.
CPC ....... *H01R 13/6471* (2013.01); *H01R 12/727* (2013.01)

(58) Field of Classification Search
CPC .. H01R 12/72; H01R 12/727; H01R 13/6471; H01R 13/6461

USPC ....................................................... 439/607.1
See application file for complete search history.

(56) References Cited

U.S. PATENT DOCUMENTS

| 7,615,708 | B2 * | 11/2009 | Hsu | H01L 23/49822 |
| | | | | 174/261 |
| 2007/0194432 | A1 * | 8/2007 | Hsu | H01L 23/49822 |
| | | | | 257/698 |

FOREIGN PATENT DOCUMENTS

| TW | I278268 | 4/2007 |
| TW | I476992 | 3/2015 |
| TW | 201713091 | 4/2017 |

OTHER PUBLICATIONS

"Office Action of Taiwan Related Application, application No. 109127289", dated Jul. 14, 2021, p. 1-p. 13.
"Office Action of Taiwan Counterpart Application", dated Sep. 29, 2021, p. 1-p. 6.

* cited by examiner

*Primary Examiner* — Khiem M Nguyen
(74) *Attorney, Agent, or Firm* — JCIPRNET

(57) ABSTRACT

A contact arrangement, including multiple contacts, is provided. The contacts are staggered. Some of the contacts form at least one contact group. The at least one contact group includes a pair of first contacts and eight second contacts. The pair of first contacts is a pair of differential signal contacts. The second contacts are arranged around the pair of first contacts. Two of the second contacts are arranged along a straight line perpendicular to a connecting line of the pair of first contacts. The position distribution and electrical properties of the other six of the second contacts are symmetrical to each other relative to the straight line.

19 Claims, 6 Drawing Sheets

CONTACT ARRANGEMENT, CIRCUIT BOARD, AND ELECTRONIC ASSEMBLY

CROSS-REFERENCE TO RELATED APPLICATION

This application claims the priority benefit of Taiwan application serial no. 109127288, filed on Aug. 12, 2020. The entirety of the above-mentioned patent application is hereby incorporated by reference herein and made a part of this specification.

BACKGROUND

Technical Field

The disclosure relates to a contact arrangement, and more particularly to a contact arrangement, a circuit board, and an electronic assembly.

Description of Related Art

The land grid array (LGA) is a type of chip packaging in which multiple pads are arranged in the form of a grid array at the bottom of a chip packaging element. At present, the central processing unit (CPU) of a desktop computer has widely adopted the LGA and is installed on the motherboard of the computer via the corresponding socket connector. The corresponding socket connector has multiple elastic terminals. One end of each elastic terminal is soldered to the motherboard, and the other end of each elastic terminal is in contact with the pad of the CPU. Although the LGA may provide higher contact density, the signal transmission between the elastic terminals may easily interfere with each other.

SUMMARY

The disclosure provides a contact arrangement, which is configured to improve the quality of signal transmission.

The disclosure provides a circuit board, which is configured to improve the quality of signal transmission.

The disclosure provides an electronic assembly, which is configured to improve the quality of signal transmission.

The contact arrangement according to another embodiment of the disclosure includes multiple contacts. The contacts are staggered. Some of the contacts form at least one contact group. The at least one contact group includes a pair of first contacts and eight second contacts. The pair of first contacts is a pair of differential signal contacts. The second contacts are arranged around the pair of first contacts. Two of the second contacts are arranged along a straight line perpendicular to a connecting line of the pair of first contacts. The position distribution and electrical properties of the other six of the second contacts are symmetrical to each other relative to the straight line.

The circuit board according to another embodiment of the disclosure has a surface and multiple contacts located on the surface. The position distribution and electrical properties of the contacts are the same as the position distribution and electrical properties of any contact arrangement according to the foregoing embodiments.

The electronic assembly according to another embodiment of the disclosure includes a chip package, a motherboard, and a socket electrical connector installed on the motherboard. The chip package has a surface and multiple contacts located on the surface. The position distribution and electrical properties of the contacts are the same as the position distribution and electrical properties of any contact arrangement according to the foregoing embodiments. The contacts are respectively in contact with multiple elastic terminals of the socket electrical connector. The elastic terminals are respectively soldered to the motherboard.

Based on the above, in the embodiments of the disclosure, the multiple second contacts are arranged around the pair of first contacts, and the electrical properties of the first contacts and the second contacts are set, so that the pair of first contacts as a pair of differential signal contacts may be referenced to the same number of second contacts as power contacts or ground contacts to have the same high-frequency electrical characteristics, thereby improving the quality of signal transmission.

DETAILED DESCRIPTION OF DISCLOSED EMBODIMENTS

Figure 1A:
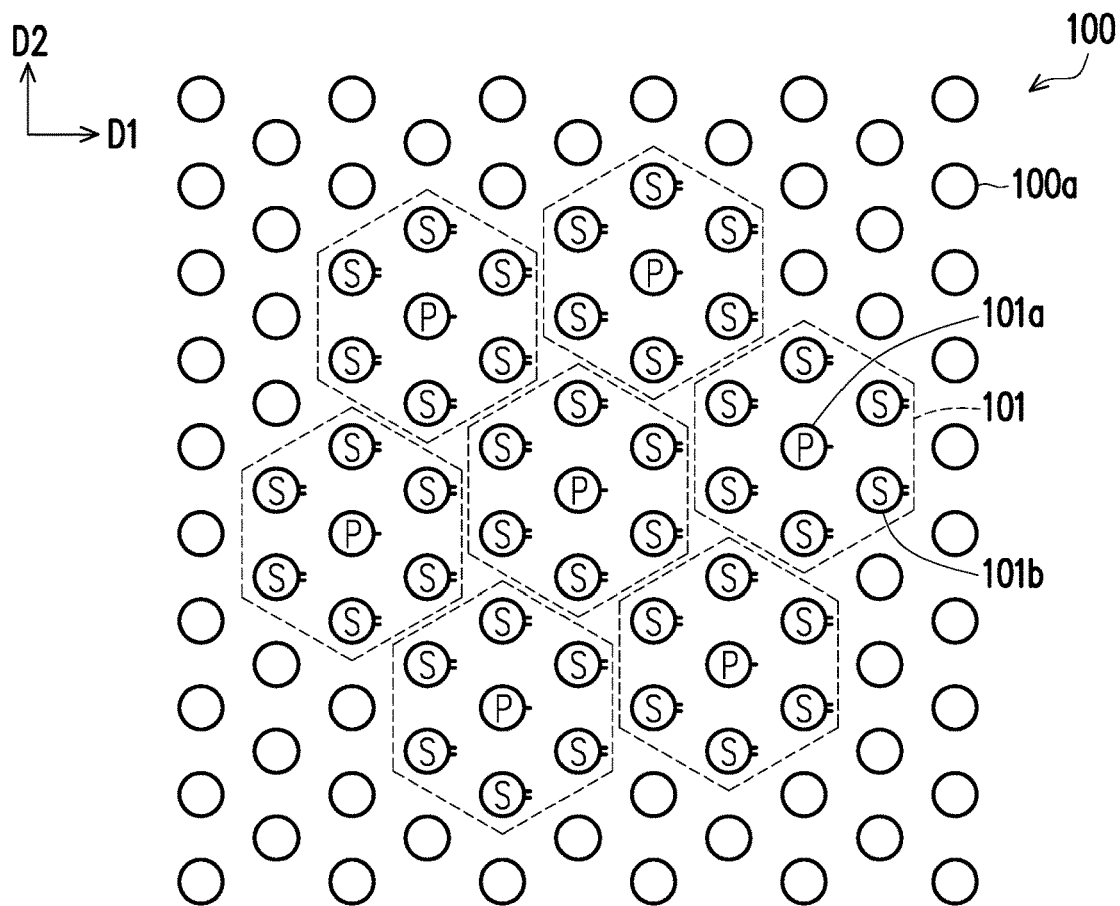
FIG. 1A is a schematic diagram of a contact arrangement according to an embodiment of the disclosure.
Figure 1B:
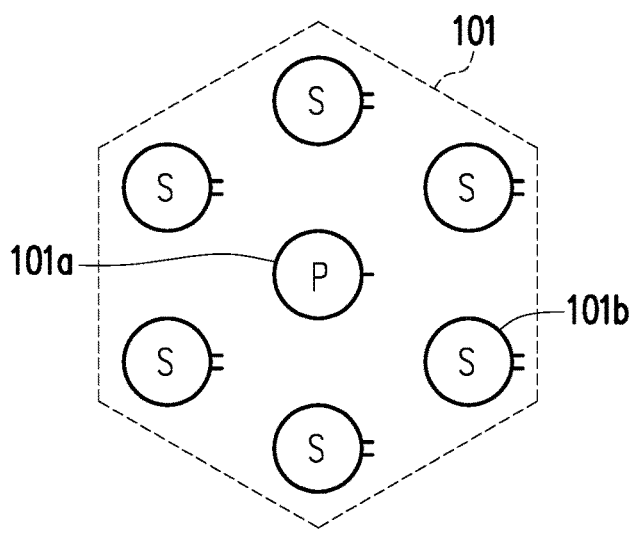
FIG. 1B is a schematic diagram of a contact group of FIG. 1A.

Please refer to FIG. 1A and FIG. 1B. In the embodiment, a contact arrangement 100 includes multiple contacts 100a. The contacts 100a are staggered. The so-called "staggered" refers to that the projections in a second direction D2 of two adjacent rows of the contacts 100a in a first direction D1 do not overlap. Similarly, the projections in the first direction D1 of two adjacent columns of the contacts 100a in the second direction D2 do not overlap. Some of the contacts 100a form at least one contact group 101. In the embodiment, some of the contacts 100a form multiple contact groups 101. Each contact group 101 includes a first contact 100a and six second contacts 100b. The second contacts 100b are arranged around the first contact 100a. The right side of the first contact 100a is labelled with one dash, and the right side of the second contact 100b is labelled with two dashes. In the embodiment, the first contact 100a is a power contact (labelled as P), and the second contacts 100b are signal contacts (labeled as S). In another embodiment, the first contact 100a may also be a ground contact (labelled as G, not shown in FIG. 1A). When the first contact 100a is a power or ground contact and the second contacts 100b are signal contacts, the first (power or ground) contact 100a may serve as an electrical return path of the second (signal) contacts 100b with a shielding effect.

Please refer to FIG. 1B. For the one contact group 101, the first contact 100a is equidistant from each second contact 100b in the same contact group 101. In other words, for the one contact group 101, the distance between the center point of the first contact 100a and the center point of any one second contact 100b is equal to the distance between the center point of the first contact 100a and the center point of another second contact 100b. In addition, the distance between the center point of the first contact 100a and the center point of any one second contact 100b is equal to the distance between the center points of any two adjacent second contacts 100b. The first contact 100a and the second contact 100b are arranged into a virtual regular hexagon with the first contact 100a as the center and the second contacts 100b equidistantly surrounding the first contact 100a. It is worth mentioning that for the one contact group 101, when the first contact 100a is a power contact and the second contacts 100b are signal contacts, each second (signal) contact 100b may correspond to the same number (for example, 1) of first (power) contact 100a. The corresponding first (power) contact 100a is located at the center point of the same contact group 101. Moreover, since the first (power) contact 100a is equidistant from each second (signal) contact 100b, each second (signal) contact 100b has almost similar high-frequency electrical characteristics due to a common reference point (the first contact 100a) for the same one contact group 101. In addition, since the same contact group 101 is arranged into a virtual hexagon, the first contact 100a and each second contact 100b are close to each other to have a shorter electrical return path and better noise shielding, thereby experiencing less interference from the outside world.

Please refer to FIG. 1A again. In the embodiment, the contact groups 101 are independent of each other, which means that each of the contact groups 101 does not share the second contact 100b. In addition, please refer to FIG. 2. In the embodiment, the contact groups 101 share one of the second contacts 100b. In addition, please refer to FIG. 3. In the embodiment, the contact groups 101 share two of the second contacts 100b. For the embodiments of FIG. 2 and FIG. 3, two adjacent contact groups 101 share at least one second contact 100b, so that for the contact layout, more contact groups 101 may be arranged in the same circuit board area. In addition, each contact group 101 is arranged into a virtual regular hexagon. When two adjacent virtual regular hexagons partially overlap, more virtual regular hexagons, that is, more contact groups 101, may be arranged in the same circuit board area.

Figure 4A:
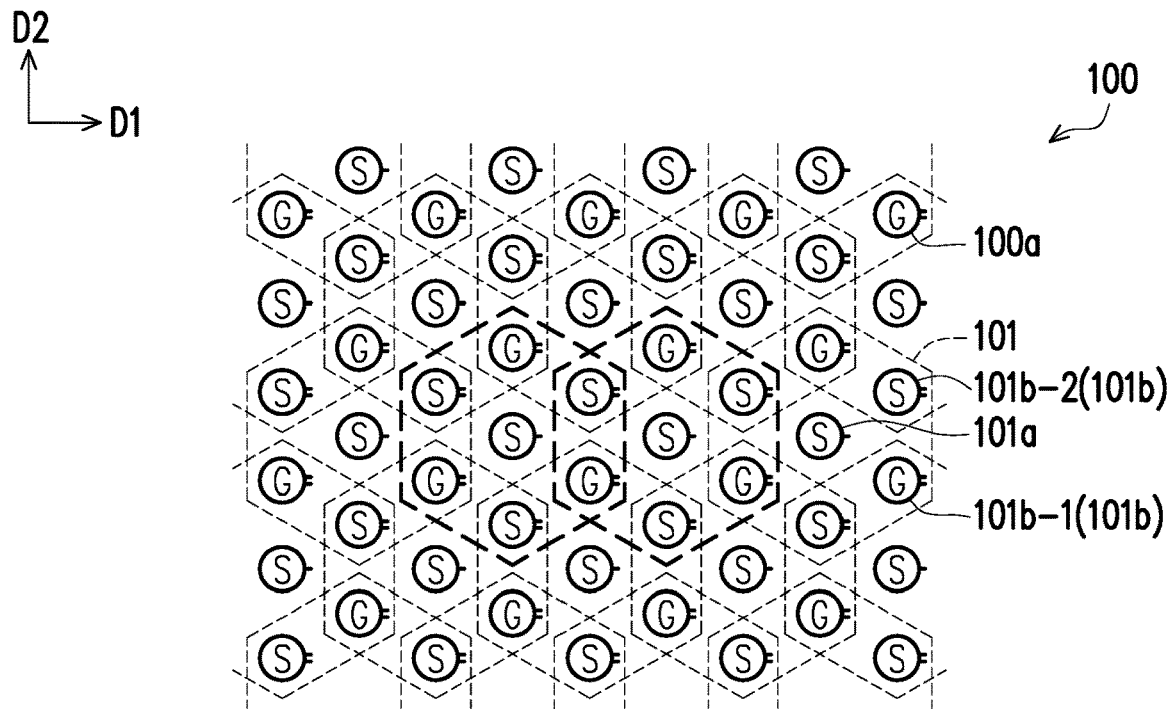
FIG. 4A is a schematic diagram of a contact arrangement according to another embodiment of the disclosure.
Figure 4B:
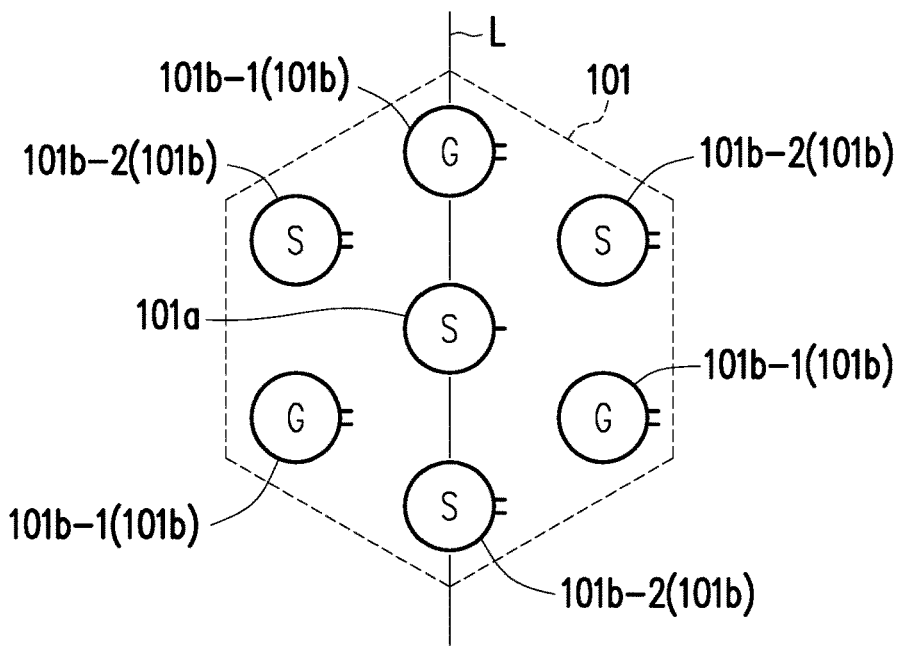
FIG. 4B is a schematic diagram of a contact group of FIG. 4A.

Please refer to FIG. 4A and FIG. 4B. In the embodiment, for the one contact group 101, the first contact 100a is a signal contact, and three second contacts 100b-1 of the second contacts 100b are ground contacts and are not adjacent to each other. In another embodiment, the three second contacts 100b-1 may also be power contacts. In the embodiment, for the same one contact group 101, when the first contact 100a is a signal contact and the second contacts 100b-1 are ground contacts, each first (signal) contact 100a may correspond to the same number (for example, 3) of second (ground) contacts 100b-1. Also, since the first (signal) contact 100a is equidistant from each second (ground) contact 100b-1, each first (signal) contact 100a has a common reference point, thereby having almost similar high-frequency electrical characteristics.

In addition, the first contact 100a (i.e. signal contact) of each contact group 101 may be electrically referenced to the three second contacts 100b-1 as ground contacts or power contacts to serve as an electrical return path, thereby having a better noise shielding effect.

Please refer to FIG. 4A again. In the embodiment, the first contact 100a is a signal contact, and the other three second contacts 100b-2(100b) of the second contacts 100b are also signal contacts. The second contacts 100b-1 as power contacts or ground contacts and the second contacts 100b-2 as signal contacts are further alternated around the first contact 100a as a signal contact. In addition, any two adjacent contact groups 101 share two of the second contacts 100b (adjacent second (ground) contact 100b-1 and second (signal) contact 100b-2)). In other words, for each contact group 101 arranged into a virtual regular hexagon, when two adjacent second (ground or power) contact 100b-1 and second (signal) contact 100b-2 in the virtual regular hexagon are shared, the shared second (signal) contact 100b-2 may also be electrically referenced to three equidistant surrounding second (ground or power) contacts 100b-1 to serve as a return path. For the embodiment of FIG. 4A and FIG. 4B, two adjacent contact groups 101 share at least two second contacts (second contact 100b-1 and second contact 101b-2), so that for the contact layout, more contact groups 101 may be arranged in the same circuit board area. In addition, each contact group 101 is arranged into a virtual regular hexagon. When two adjacent virtual regular hexagons partially overlap, more virtual hexagons, that is, more contact groups 101 may be arranged in the same circuit board area.

Please refer to FIG. 4B again. The first contact 100a and one of the second contacts 100b are arranged in a straight line L. The position distribution and electrical properties (such as a signal S, a power P, a ground G, etc.) of the second contacts 100b are symmetrical to each other relative to the straight line L.

Figure 2:
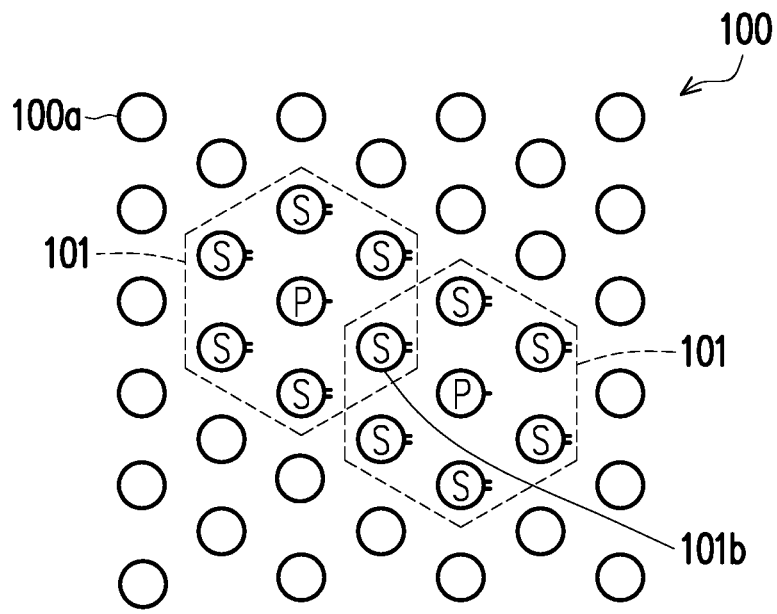
FIG. 2 is a schematic diagram of a contact arrangement according to another embodiment of the disclosure.
Figure 3:
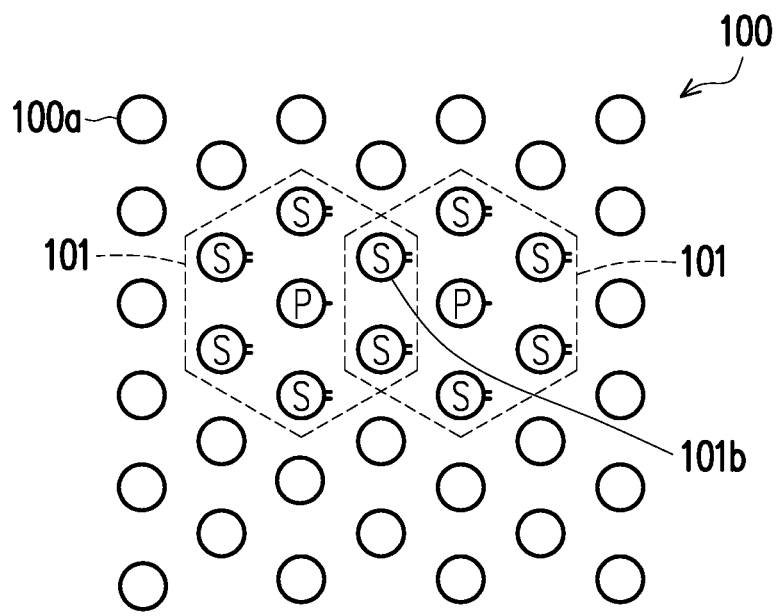
FIG. 3 is a schematic diagram of a contact arrangement according to another embodiment of the disclosure.

The contact arrangement 100 according to the embodiments of FIG. 1A, FIG. 2, and FIG. 3 may be applied to the contact arrangement of a single-ended unidirectional signal, such as the contact arrangement of a CMD signal and a Ctrl signal of a double-data-rate fourth generation synchronous dynamic random access memory (DDR4). In detail, the first contact 100a is a power or ground contact, the second contact 100b is the CMD signal or the Ctrl signal, and each of the second contacts 100b uses the first contact 100a as an electrical reference point. The contact arrangement 100 according to the embodiment of FIG. 4A may be applied to the contact arrangement of a single-ended bidirectional signal, such as the contact arrangement of a data signal of the DDR4. In detail, the first contact 100a is the data signal contact, the second contact 100b-2 is a power or ground contact, and the first contact 100a uses multiple surrounding second contacts 100b-2 as electrical reference points.

Figure 5A:
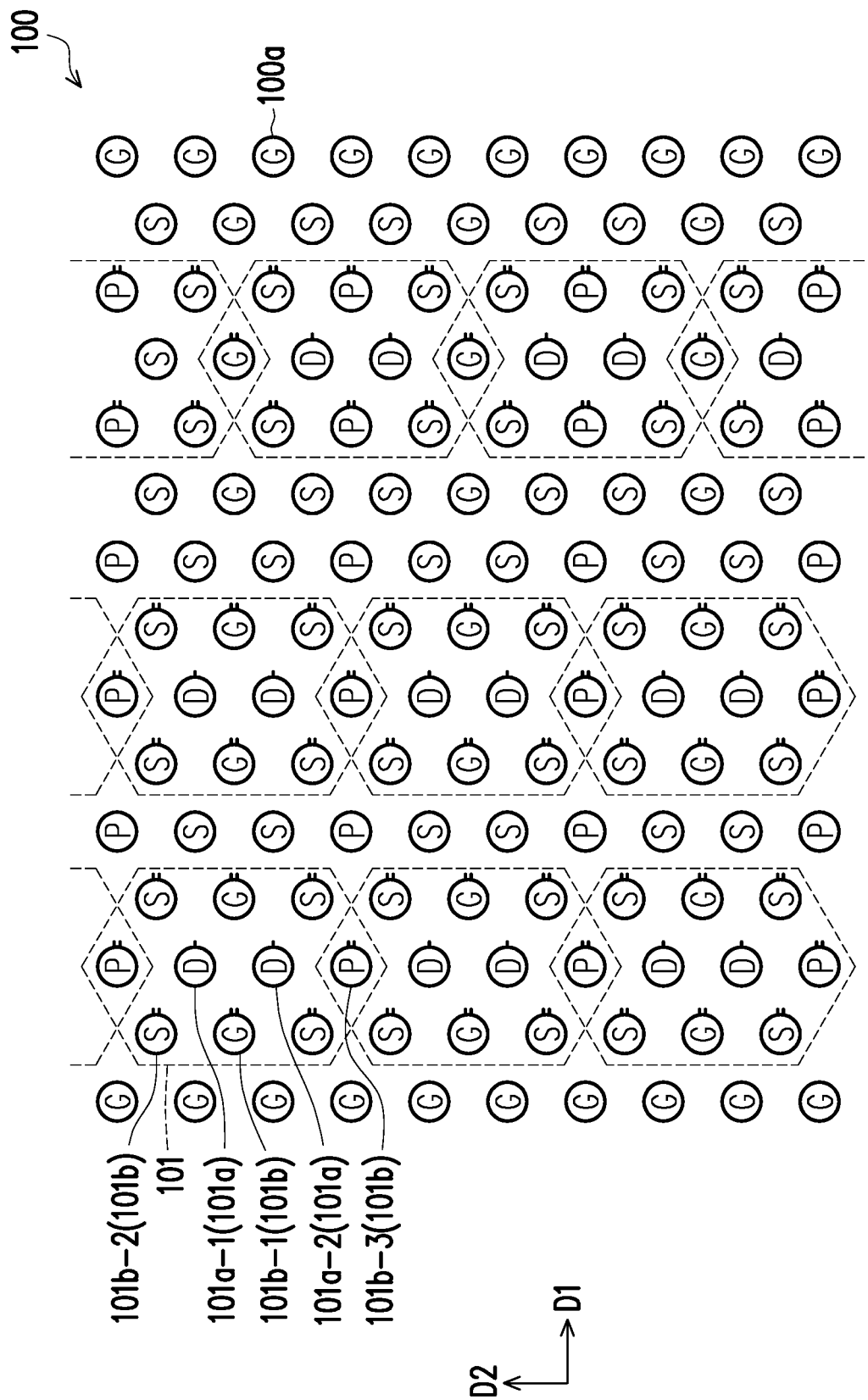
FIG. 5A is a schematic diagram of a contact arrangement according to another embodiment of the disclosure.
Figure 5B:
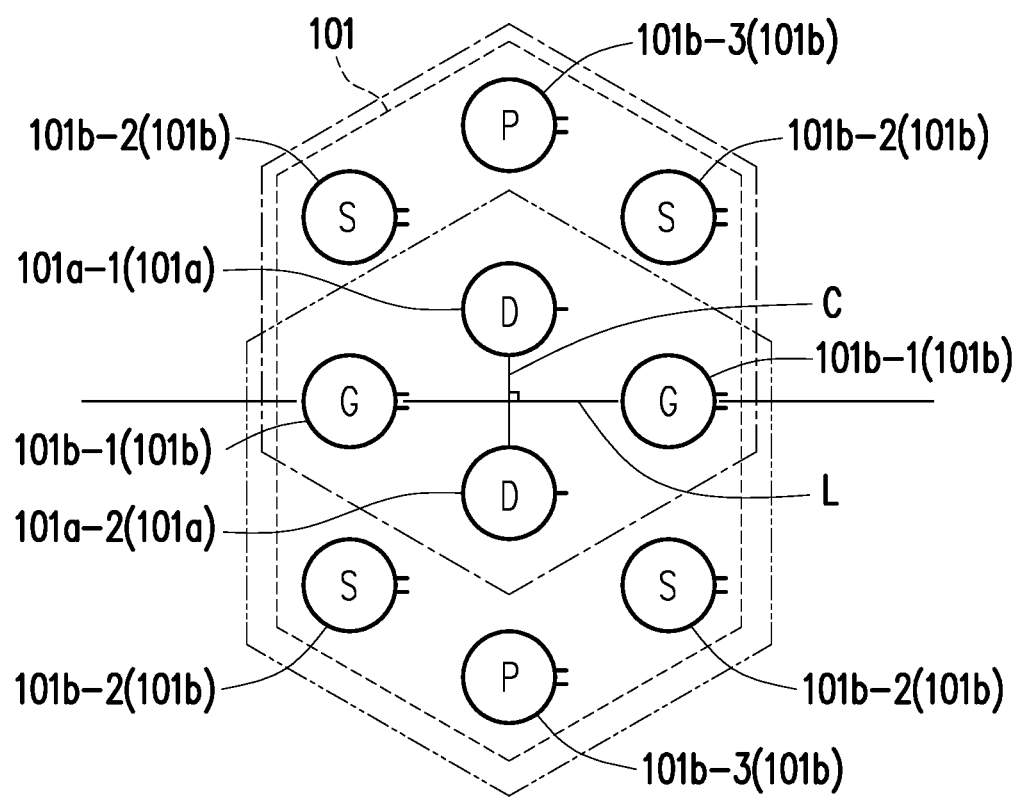
FIG. 5B is a schematic diagram of a contact group of FIG. 5A.

Please refer to FIG. 5A and FIG. 5B. In the embodiment, the contact arrangement 100 includes multiple contacts 100a that are staggered. The so-called "staggered" refers to that the projections in a second direction D2 of two adjacent rows of the contacts 100a in a first direction D1 do not overlap. Similarly, the projections in the first direction D1 of two adjacent columns of the contacts 100a in the second direction D2 do not overlap. Some of the contacts 100a form at least one contact group 101. In the embodiment, some of the contacts 100a form multiple contact groups 101. Each contact group 101 includes a pair of first contacts 100a (first contact 100a-1 and first contact 100a-2) and eight second contacts 100b (2 second contacts 100b-1, 4 second contacts 100b-2, and 2 second contacts 100b-3). The pair of first contacts 100a is a pair of differential signal contacts. The eight second contacts 100b are arranged around the pair of first contacts 100a.

Please refer to FIG. 5B again. In the embodiment, two second contacts 100b-1 of the second contacts 100b are arranged along a straight line L perpendicular to a connecting line C of the pair of first contacts 100a. Also, the position distribution and electrical properties of the other six (4 second contacts 100b-2 and 2 second contacts 100b-3) of the second contacts 100b are symmetrical to each other relative to the straight line L, that is, the straight line L may be regarded as a symmetry axis. Furthermore, the pair of first contacts 100a, the two second contacts 100b-1 passing through the straight line L, and the three second contacts 100b (2 second contacts 100b-2 and 1 second contact 100b-3) above the straight line L constitute a virtual regular hexagon. The pair of first contacts 100a, the two second contacts 100b-2 passing through the straight line L, and the three second contacts 100b (2 second contacts 100b-2 and 1 second contact 100b-3) below the straight line L constitute another virtual regular hexagon. Therefore, based on the upper and lower symmetry relationship, the two second contacts 100b-1 passing through the straight line L have the same electrical properties, for example, both are ground contacts, and the three second contacts 100b above the straight line L and the three second contacts 100b below the straight line L respectively have the same electrical properties, for example, both are sequentially the signal contact 100b-2, the power contact 100b-3, and the signal contact 100b-2. It is important and necessary for the pair of first (differential signal) contacts 100a to have the same electrical properties due to symmetry.

Please refer to FIG. 5B again. In the embodiment, one first contact 100a-1 of the pair of first contacts 100a is equidistant from the surrounding second contacts 100b (second contacts 100b-1, 100b-2, and 101-3) and the other first contact 100a-2 of the pair of first contacts 100a. In addition, in the embodiment, the number (for example, 1) of the second contact 100b-3 as a power contact around the one first contact 100a-1 of the pair of first contacts 100a is the same as the number of the second contact 100b-3 as a power contact around the other first contact 100a-2 of the pair of first contacts 100a. Also, the number (for example, 1) of the second contact 100b-1 as a ground contact around the one first contact 100a-1 of the pair of first contacts 100a is the same as the number of the second contact 101b-1 as a ground contact around the other first contact 100a-2 of the pair of first contacts 100a. The power contact or the ground contact may serve as the electrical return path of the pair of first contacts, and may also serve as a noise shield.

Figure 6:
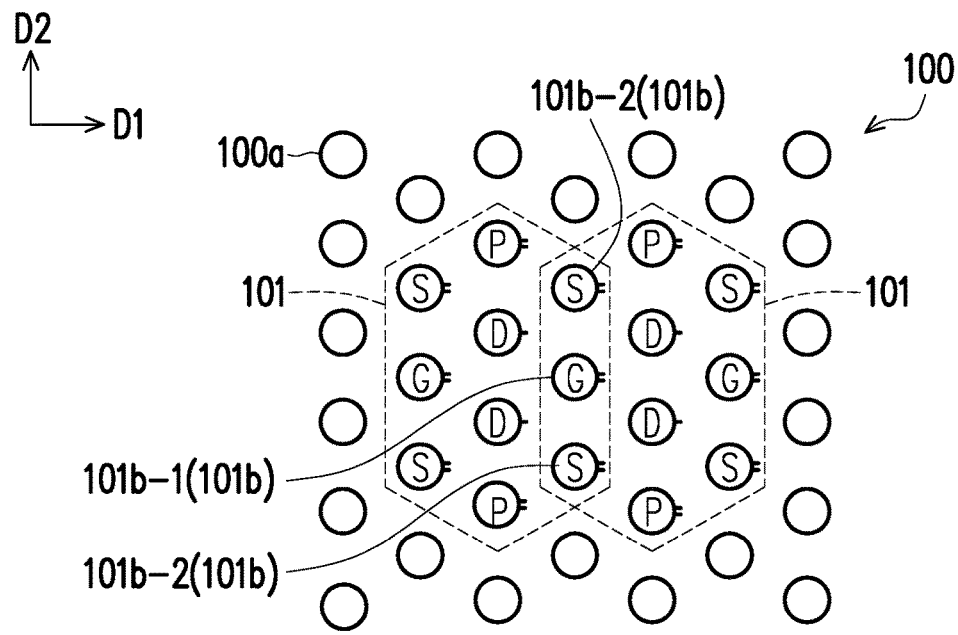
FIG. 6 is a schematic diagram of a contact arrangement according to another embodiment of the disclosure.

Please refer to FIG. 5A again. In the embodiment, the contact groups 101 are independent of each other, which means that the contact groups 101 do not share the second contact 100b. In addition, please refer to FIG. 6. In the disclosure, the number of at least one contact group 101 includes multiple, and two adjacent contact groups of the contact groups 101 share at least one of the second contact 100b. Two adjacent contact groups 101 in the first orientation D1 of FIG. 6 share three second contacts 101b.

The contact arrangement 100 according to the embodiment of FIG. 5A may be applied to a contact arrangement with multiple pairs of differential signals, such as the contact arrangement of a differential signal pair of a peripheral component interconnect-express (PCI-E) and a universal serial bus 3.0 (USB 3.0). In detail, the pair of first contacts 100a are differential signal contacts, and the second contact 100b-1/100b-3 is a ground/power contact. The pair of first contacts 100a uses the second contact 100b-1/100b-3 as an electrical reference point. Also, each first contact 100a corresponds to the same number of second contact 100b-1/100b-3, and the second contact 100b-1/100b-3 is symmetrical in spatial layout.

Figure 7:
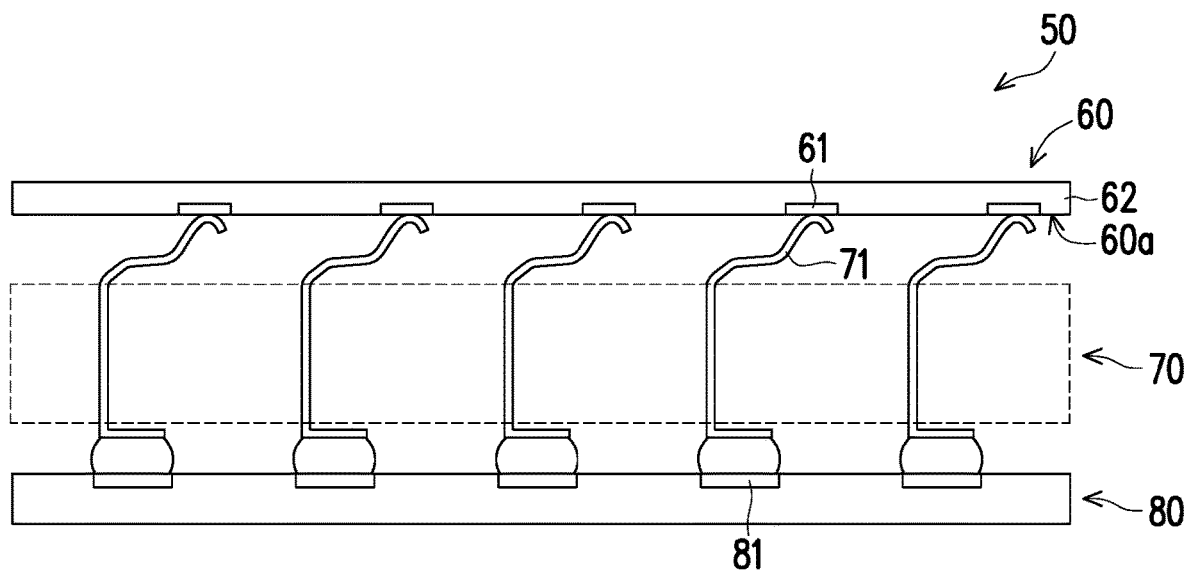
FIG. 7 is a schematic diagram of an electronic assembly according to another embodiment of the disclosure.

Please refer to FIG. 7. In the embodiment, an electronic assembly 50 includes a chip package 60, a motherboard 80, and a socket electrical connector 70 installed on the motherboard 80. The chip package 60 has a surface 60a and multiple contacts 61 located on the surface. The position distribution and electrical properties of the contacts 61 are the same as the position distribution and electrical properties of the contact arrangement 100 according to any of the foregoing embodiments. The contacts 61 are respectively in contact with multiple elastic terminals 71 of the socket electrical connector 70. Each of the elastic terminals 71 is soldered to the motherboard 80. The chip package 60 has a chip packaging substrate 62, which has a surface 60a and the contacts 61 located on the surface 60a. The chip packaging substrate 62 may be regarded as a circuit board, and the motherboard 80 may also be regarded as a circuit board. In addition, the motherboard 80 has multiple contacts 81, which are configured to be respectively soldered to the elastic terminals 71. Similar to the contacts 61 of the chip packaging substrate 62, the position distribution and electrical properties of the elastic terminals 71 also correspond to the position distribution and electrical properties of the contact arrangement 100 according to any of the foregoing embodiments, and the position distribution and electrical properties of the contacts 81 also correspond to the position distribution and electrical properties of the contact arrangement 100 according to any of the foregoing embodiments.

In summary, in the embodiments of the disclosure, the multiple second contacts are arranged around the first contact or the pair of first contacts, and the electrical properties of the first contacts and the second contacts are set, so that the first contact as a signal contact or the pair of first contacts as a pair of differential signal contacts may be referenced to the same number of second contacts as power contacts or ground contacts, so as to have the same high-frequency electrical characteristics, thereby improving the quality of signal transmission.

What is claimed is:

1. A contact arrangement, comprising:
a plurality of contacts, being staggered, wherein a plurality of the plurality of contacts form at least one contact group, and the at least one contact group comprises:
a pair of first contacts, as a pair of differential signal contacts; and
eight second contacts, arranged around the pair of first contacts, wherein two of the plurality of second contacts are arranged along a straight line perpendicular to a connecting line of the pair of first contacts, and position distribution and electrical properties of the other six of the plurality of second contacts are symmetrical to each other relative to the straight line.

2. The contact arrangement according to claim 1, wherein one of the pair of first contacts is equidistant from the surrounding plurality of second contacts and the other one of the pair of first contacts.

3. The contact arrangement according to claim 1, wherein a number of the plurality of second contacts as power contacts around one of the pair of first contacts is the same as the number of the plurality of second contacts as power contacts around the other one of the pair of first contacts, and a number of the plurality of second contacts as ground contacts around one of the pair of first contacts is the same as the number of the plurality of second contacts as ground contacts around the other one of the pair of first contacts.

4. The contact arrangement according to claim 1, wherein a number of the at least one contact group comprises multiple, and two adjacent contact groups share at least one of the plurality of second contacts.

5. The contact arrangement according to claim 1, wherein a number of the at least one contact group comprises multiple, the plurality of contact groups share three of the plurality of second contacts, and any two adjacent contact groups share three of the plurality of second contacts.

6. The contact arrangement according to claim 1, wherein one of the pair of first contacts, two of the plurality of second contacts passing through the straight line, and three of the plurality of second contacts above the straight line constitute a virtual regular hexagon.

7. The contact arrangement according to claim 6, wherein the other one of the pair of first contacts, the two of the plurality of second contacts passing through the straight line, and the three of the plurality of second contacts below the straight line constitute another virtual regular hexagon.

8. A circuit board, having a surface and a contact arrangement located on the surface, wherein the contact arrangement comprises:
   a plurality of contacts, being staggered, wherein a plurality of the plurality of contacts form at least one contact group, and the at least one contact group comprises:
      a pair of first contacts, as a pair of differential signal contacts; and
      eight second contacts, arranged around the pair of first contacts, wherein two of the plurality of second contacts are arranged along a straight line perpendicular to a connecting line of the pair of first contacts, and position distribution and electrical properties of the other six of the plurality of second contacts are symmetrical to each other relative to the straight line.

9. The circuit board according to claim 8, wherein one of the pair of first contacts is equidistant from the surrounding plurality of second contacts and the other one of the pair of first contacts.

10. The circuit board according to claim 8, wherein a number of the plurality of second contacts as power contacts around one of the pair of first contacts is the same as the number of the plurality of second contacts as power contacts around the other one of the pair of first contacts, and a number of the plurality of second contacts as ground contacts around one of the pair of first contacts is the same as the number of the plurality of second contacts as ground contacts around the other one of the pair of first contacts.

11. The circuit board according to claim 8, wherein a number of the at least one contact group comprises multiple, and two adjacent contact groups share at least one of the plurality of second contacts.

12. The circuit board according to claim 8, wherein a number of the at least one contact group comprises multiple, the plurality of contact groups share three of the plurality of second contacts, and any two adjacent contact groups share three of the plurality of second contacts.

13. The circuit board according to claim 8, wherein the circuit board is a chip packaging substrate.

14. The circuit board according to claim 8, wherein the circuit board is a motherboard configured to install an elastic terminal type socket electrical connector.

15. An electronic assembly, comprising a chip package, a motherboard, and a socket electrical connector installed on the motherboard, wherein the chip package has a surface and a contact arrangement located on the surface, the contact arrangement comprises a plurality of contacts, the plurality of contacts are staggered and are respectively in contact with a plurality of elastic terminals of the socket electrical connector, and each of the plurality of elastic terminals is soldered to the motherboard, wherein a plurality of the plurality of contacts form at least one contact group, and the at least one contact group comprises:
   a pair of first contacts, as a pair of differential signal contacts; and
   eight second contacts, arranged around the pair of first contacts, wherein two of the plurality of second contacts are arranged along a straight line perpendicular to a connecting line of the pair of first contacts, and position distribution and electrical properties of the other six of the plurality of second contacts are symmetrical to each other relative to the straight line.

16. The electronic assembly according to claim 15, wherein one of the pair of first contacts is equidistant from the surrounding plurality of second contacts and the other one of the pair of first contacts.

17. The electronic assembly according to claim 15, wherein a number of the plurality of second contacts as power contacts around one of the pair of first contacts is the same as the number of the plurality of second contacts as power contacts around the other one of the pair of first contacts, and a number of the plurality of second contacts as ground contacts around one of the pair of first contacts is the same as the number of the plurality of second contacts as ground contacts around the other one of the pair of first contacts.

18. The electronic assembly according to claim 15, wherein a number of the at least one contact group comprises multiple, and two adjacent contact groups share at least one of the plurality of second contacts.

19. The electronic assembly according to claim 15, wherein a number of the at least one contact group comprises multiple, the plurality of contact groups share three of the plurality of second contacts, and any two adjacent contact groups share three of the plurality of second contacts.

* * * * *